(12) United States Patent
Kim

(10) Patent No.: US 7,881,051 B2
(45) Date of Patent: Feb. 1, 2011

(54) MEMORY MODULE AND COVER THEREFOR

(75) Inventor: Hyekyung (Sophia) Kim, Lathrop, CA (US)

(73) Assignee: Micron Technology, Inc., Boise, ID (US)

( * ) Notice: Subject to any disclaimer, the term of this patent is extended or adjusted under 35 U.S.C. 154(b) by 363 days.

(21) Appl. No.: 11/714,314

(22) Filed: Mar. 6, 2007

(65) Prior Publication Data

US 2008/0218957 A1   Sep. 11, 2008

(51) Int. Cl.
G06F 1/16 (2006.01)
H05K 5/00 (2006.01)
H05K 7/00 (2006.01)

(52) U.S. Cl. .............................................. 361/679.31
(58) Field of Classification Search .............. 361/684, 361/679.31–679.33, 679.02
See application file for complete search history.

(56) References Cited

U.S. PATENT DOCUMENTS

| | | | | |
|---|---|---|---|---|
| 5,327,328 A * | 7/1994 | Simms et al. | ................. | 362/26 |
| 5,349,504 A * | 9/1994 | Simms et al. | ................. | 362/555 |
| 6,050,848 A * | 4/2000 | Yao | ............................. | 439/483 |
| 6,064,569 A * | 5/2000 | Sands et al. | ............ | 361/679.32 |
| 6,231,224 B1 * | 5/2001 | Gamble et al. | ......... | 361/679.33 |
| 6,431,718 B1 * | 8/2002 | Gamble et al. | ......... | 361/679.33 |
| 6,456,500 B1 * | 9/2002 | Chen | .......................... | 361/752 |
| 6,490,163 B1 * | 12/2002 | Pua et al. | .................... | 361/737 |
| 6,522,534 B1 * | 2/2003 | Wu | .......................... | 361/679.4 |
| 6,608,750 B2 * | 8/2003 | Cruz et al. | ............. | 361/679.33 |
| 6,612,853 B2 * | 9/2003 | Wu | ............................ | 439/136 |
| 6,758,689 B1 * | 7/2004 | Bair et al. | ................... | 439/136 |
| 6,763,410 B2 * | 7/2004 | Yu | ............................... | 710/74 |
| 6,894,865 B2 * | 5/2005 | Chang et al. | ............. | 360/97.01 |
| 6,932,629 B2 * | 8/2005 | Ikenoue | ...................... | 439/138 |
| 6,999,322 B1 * | 2/2006 | Lin | ............................. | 361/752 |
| 7,088,575 B2 * | 8/2006 | Chiu et al. | ............. | 361/679.31 |
| 7,092,256 B1 | 8/2006 | Salazar et al. | | |
| 7,095,617 B1 * | 8/2006 | Ni | ................................ | 361/736 |
| 7,181,053 B2 | 2/2007 | Wang et al. | | |
| 7,249,978 B1 * | 7/2007 | Ni | ................................ | 439/660 |
| 7,271,999 B2 * | 9/2007 | Rabinovitz | ............. | 361/679.33 |
| 7,307,836 B2 * | 12/2007 | Scicluna et al. | ........ | 361/679.33 |
| 7,321,489 B2 * | 1/2008 | McAlister | .............. | 361/679.33 |
| 7,341,464 B2 * | 3/2008 | Cuellar et al. | ............... | 439/135 |
| 7,485,499 B2 * | 2/2009 | Brewer et al. | ............... | 438/125 |
| 7,500,858 B2 * | 3/2009 | Emerson et al. | ............ | 439/136 |
| 7,570,484 B1 * | 8/2009 | Sivertsen | ............... | 361/679.37 |
| 2004/0233629 A1 * | 11/2004 | Wang et al. | ................. | 361/684 |

(Continued)

FOREIGN PATENT DOCUMENTS

WO   WO 03/071853 A2   9/2003

*Primary Examiner*—Jayprakash N Gandhi
*Assistant Examiner*—Adrian S Wilson
(74) *Attorney, Agent, or Firm*—Leffert Jay & Polglaze, P.A.

(57) ABSTRACT

A storage device has a memory module enclosed within a housing and a removable cover. In a first configuration of the storage device, while leaving a portion of the housing exposed, the cover encloses at least a connector that extends from the housing and that is electrically coupled to the memory module. In a second configuration of the storage device, while leaving at least the connector exposed, the cover encloses at least the portion of the housing that was exposed in the first configuration.

60 Claims, 7 Drawing Sheets

U.S. PATENT DOCUMENTS

| | | |
|---|---|---|
| 2004/0233645 A1* | 11/2004 | Chen .......................... 361/737 |
| 2005/0079738 A1* | 4/2005 | Ahn ............................. 439/1 |
| 2005/0157462 A1* | 7/2005 | Sugawara et al. ........... 361/684 |
| 2005/0181645 A1* | 8/2005 | Ni et al. ....................... 439/79 |
| 2005/0201053 A1* | 9/2005 | Scicluna et al. ............. 361/685 |
| 2006/0082963 A1 | 4/2006 | Chen |
| 2006/0155914 A1 | 7/2006 | Jobs et al. |
| 2007/0015407 A1 | 1/2007 | Loftus |

* cited by examiner

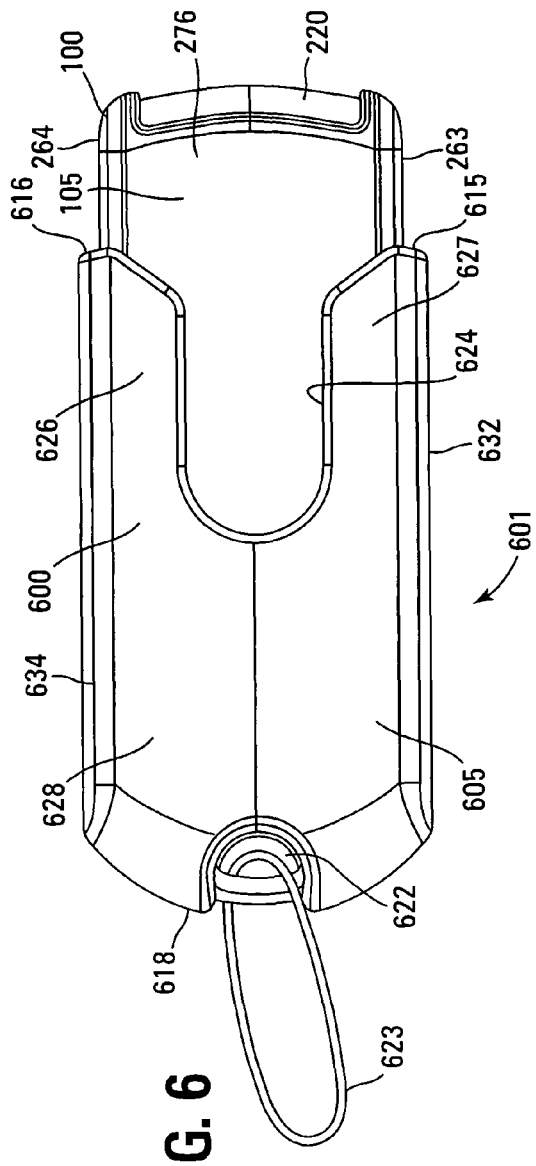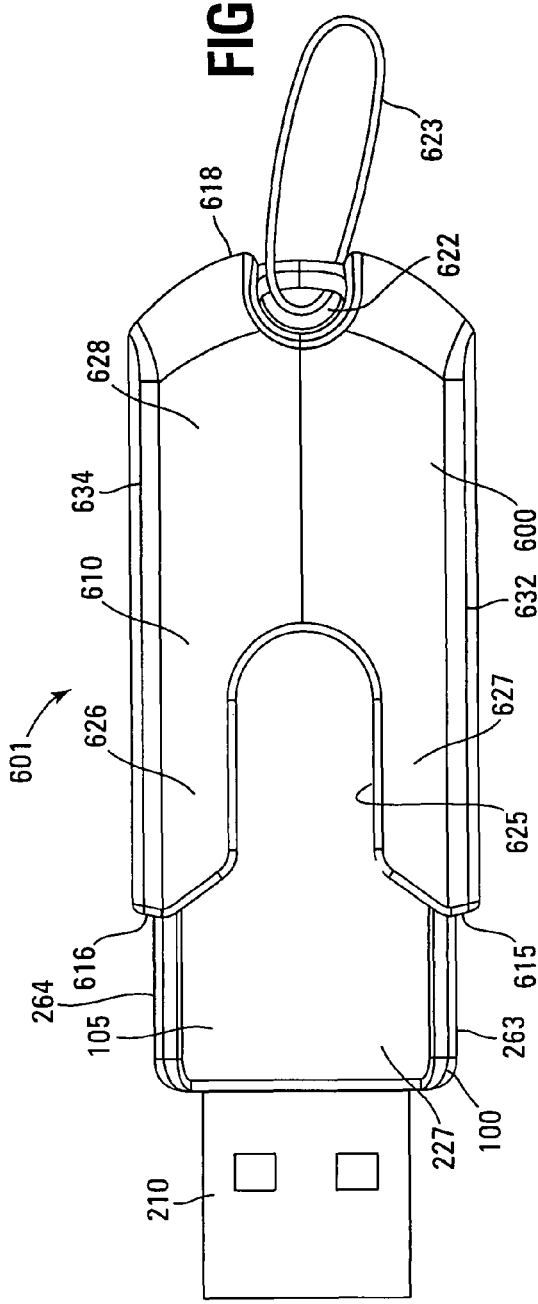

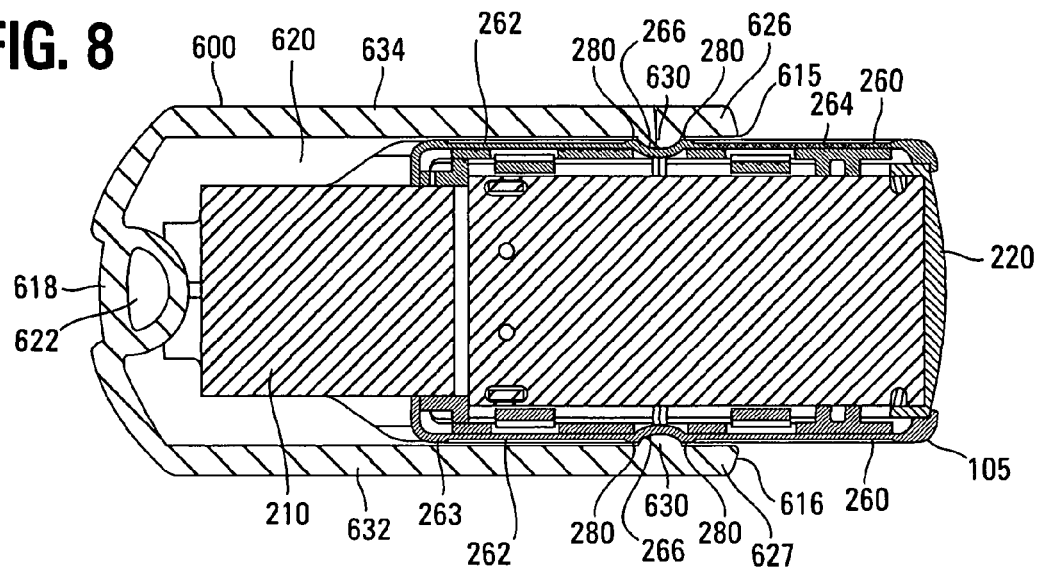
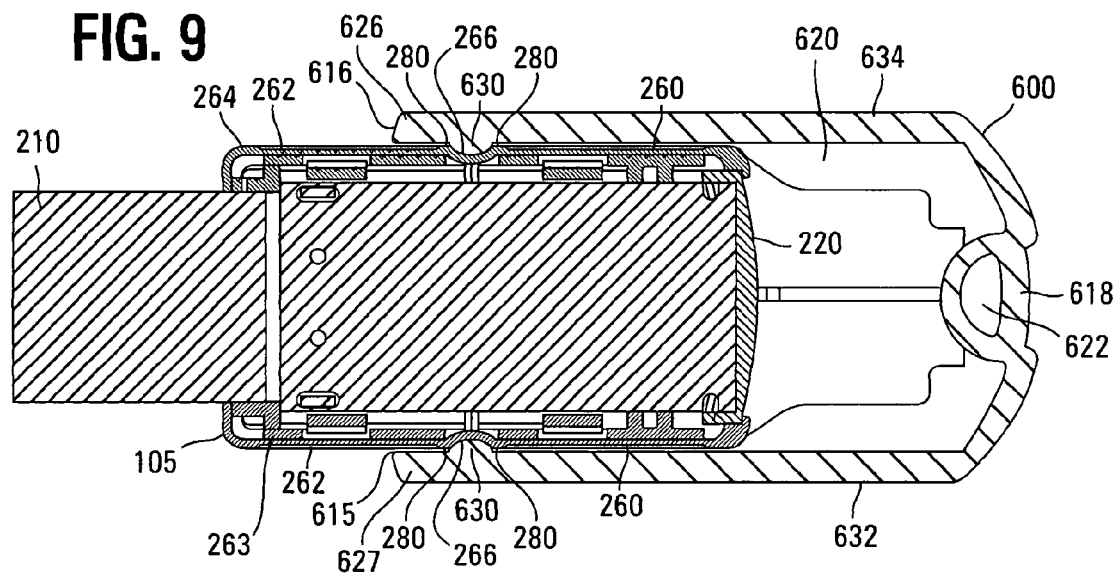

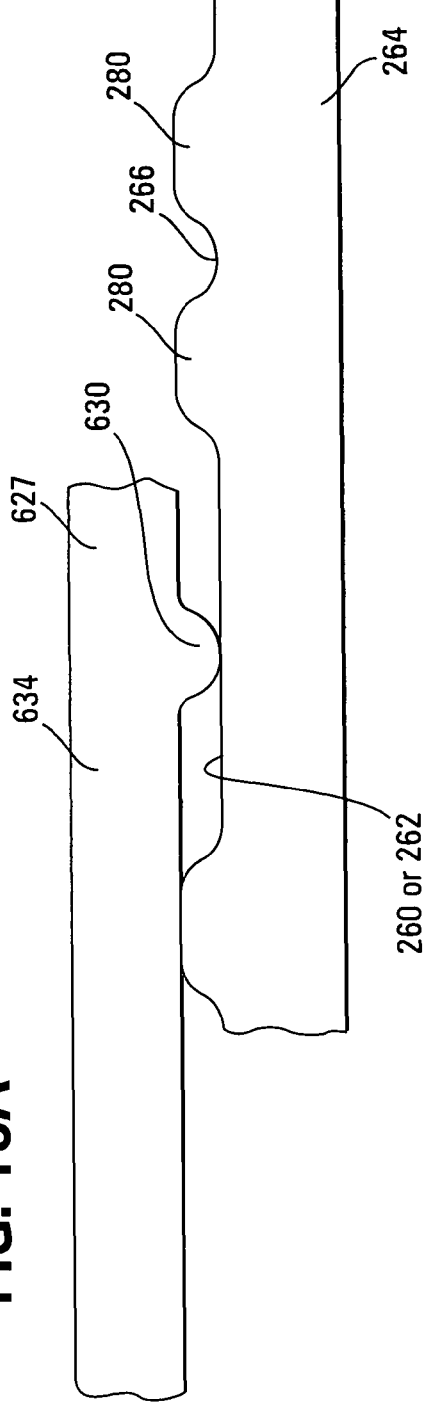
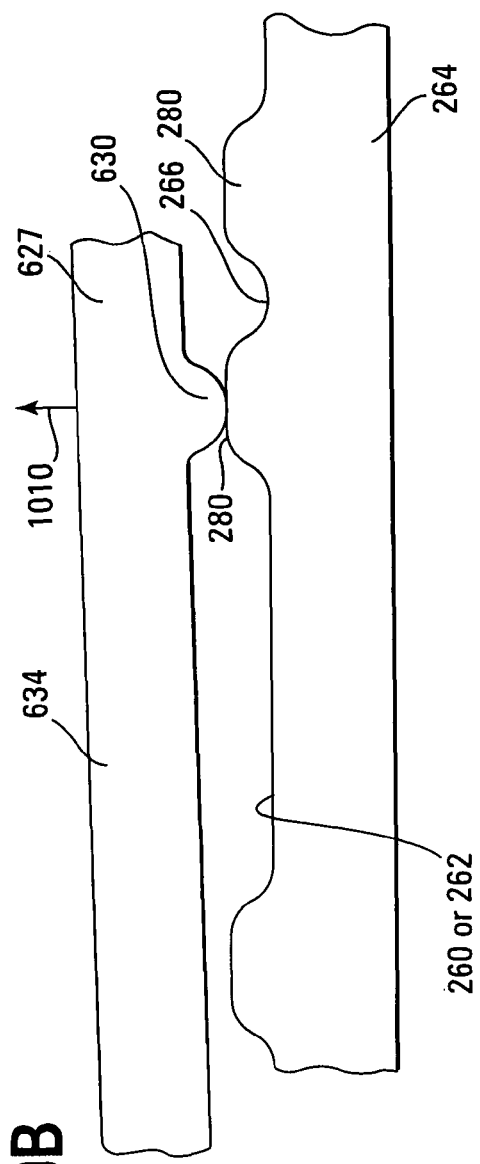

US 7,881,051 B2

MEMORY MODULE AND COVER THEREFOR

TECHNICAL FIELD OF THE INVENTION

The present disclosure relates generally to memory modules and in particular the present disclosure relates to a memory module and covers therefor.

BACKGROUND OF THE INVENTION

Removable or portable memory modules, such as removable flash memory modules, e.g., USB flash drives, have gained widespread acceptance for use as removable storage media. Generally, the memory modules are removably coupled to a host device, such as a digital camera, a digital recording and playback device, a PDA, a personal computer, a memory card reader, an interface hub, or the like, for writing data to or reading data from the host device.

The memory modules typically include one or more memory devices, such as one or more NAND, NOR, AND, or NROM flash memory devices, dynamic random access memory devices (DRAMs), static random access memory devices (SRAMs), or the like, having a memory array coupled to a controller for controlling operations of the memory array. The one or more memory devices are typically disposed on a printed circuit board and are often enclosed within a housing along with the circuit board. The housing typically includes one or more contacts, e.g., in the form of a USB connector, for connecting the memory module to the host device. However, due to the portability of these memory modules, the contacts are susceptible to damage if not properly protected. Moreover, as these memory modules become smaller, they are more easily lost and are harder to handle.

For the reasons stated above, and for other reasons stated below which will become apparent to those skilled in the art upon reading and understanding the present specification, there is a need in the art for alternatives to existing memory modules.

BRIEF DESCRIPTION OF THE DRAWINGS

FIG. 6 illustrates an embodiment of a first configuration of a storage device, according to another embodiment of the disclosure.

FIG. 7 illustrates an embodiment of a second configuration of a storage device, according to another embodiment of the disclosure.

FIG. 8 is a cross-sectional view of the first configuration of the storage device of FIG. 6, according to another embodiment of the disclosure.

FIG. 9 is a cross-sectional view of the second configuration of the storage device of FIG. 7, according to another embodiment of the disclosure.

FIGS. 10A-10C are cross-sectional views illustrating different positions of a portion of a cover relative to a portion of a housing of a memory module as the cover and housing are moved relative to each other, according to another embodiment of the disclosure.

DETAILED DESCRIPTION

In the following detailed description of the present embodiments, reference is made to the accompanying drawings that form a part hereof, and in which are shown by way of illustration specific embodiments that may be practiced. These embodiments are described in sufficient detail to enable those skilled in the art to practice disclosed subject matter, and it is to be understood that other embodiments may be utilized and that process, electrical or mechanical changes may be made without departing from the scope of the claimed subject matter. The following detailed description is, therefore, not to be taken in a limiting sense, and the scope of the claimed subject matter is defined only by the appended claims and equivalents thereof.

Figure 1:
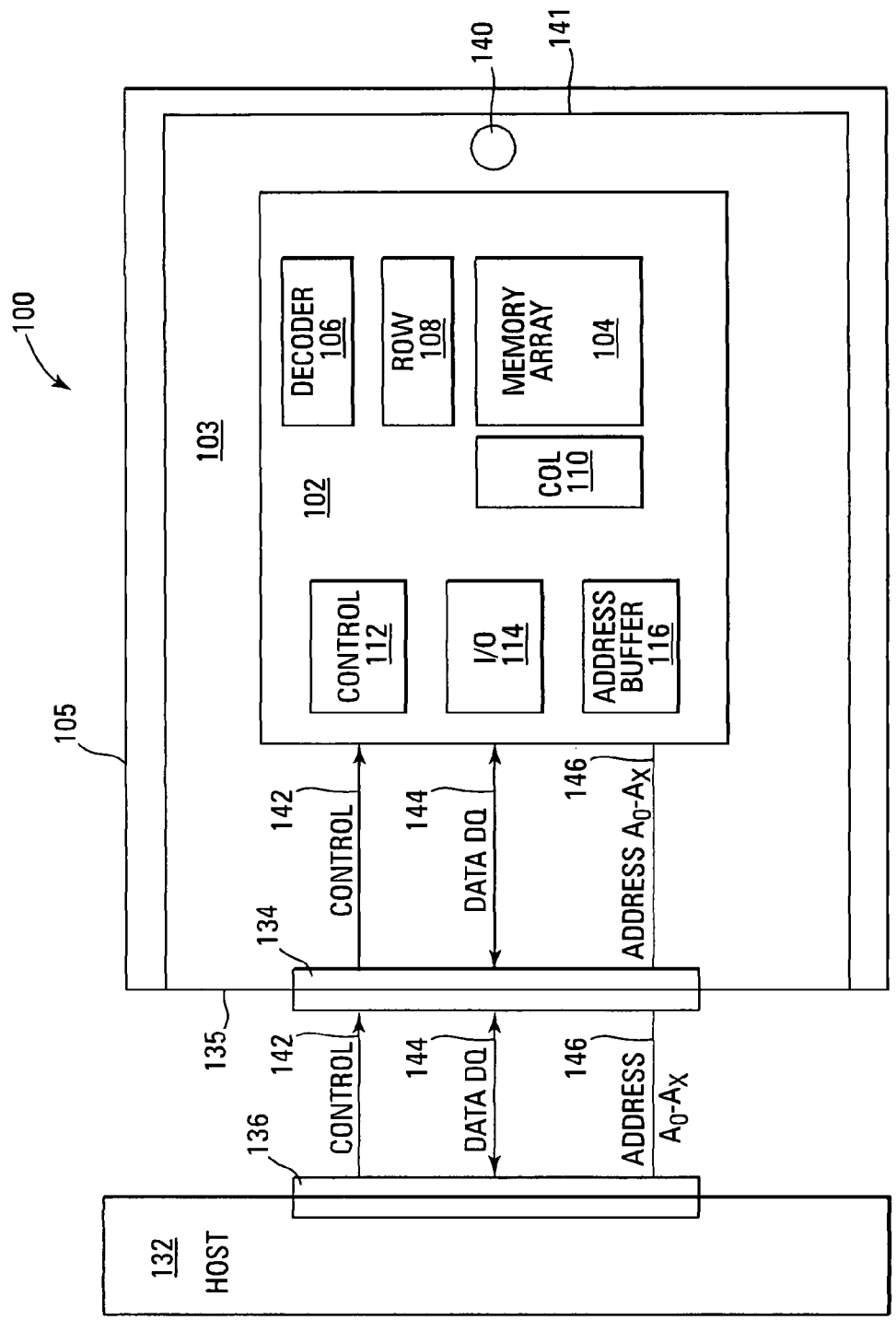
FIG. 1 is a block diagram illustration of an embodiment of a memory module, according to an embodiment of the disclosure.

FIG. 1 is a block diagram illustration of a removable or portable memory module 100, such as a USB flash drive, according to an embodiment. Memory module 100 includes one or more memory devices 102 that may be disposed on a printed circuit board 103 for one embodiment. A housing 105, formed in accordance with the disclosed embodiments, encloses memory device 102 and circuit board 103. Memory device 102 may be fabricated as semiconductor device on a semiconductor substrate, which in turn may be disposed on circuit board 103. Examples of memory devices include NAND, NOR, or NROM flash memory devices, dynamic random access memory devices (DRAMs), static random access memory devices (SRAMs), or the like.

For one embodiment, memory device 102 includes an array of memory cells 104, e.g., flash memory cells, an address decoder 106, row access circuitry 108, column access circuitry 110, control circuitry 112 coupled to memory array 104 for controlling operations of memory array 104, Input/Output (I/O) circuitry 114, and an address buffer 116. Memory device 102 may be coupled an external host device 132 by means of electrical contacts 134 disposed at an end 135 of circuit board 103 and by means of electrical contacts 136 of host device 132. For example, for one embodiment, contacts 134 might be in the form of a male connector, such as a USB Type-A male connector, and contacts 136 might be in the form of a female connector, such as a USB Type-A female connector. Examples of host devices include digital cameras, digital recording and playback devices, PDAs, personal computers, memory card readers, interface hubs, or the like.

For one embodiment, memory device 102 may be coupled to a light source 140, such as a light emitting diode (LED), that may be mounted adjacent an end 141 of circuit board 103 that is opposite end 135 of circuit board 103, as shown in FIG. 1. For some embodiments, light source 140 indicates operation of memory device 102, such as access of memory array 104.

Memory device 102 receives control signals from host device 132 over a control link 142. The memory cells are used to store data that are accessed via a data (DQ) link 144. Address signals are received via an address link 146 that are decoded at address decoder 106 to access the memory array 104. Address buffer circuit 116 latches the address signals. The memory cells are accessed in response to the control signals and the address signals. Note that control link 142, data (DQ) link 144, and address link 146 are formed when contacts 144 of memory module 100 are electrically connected to contacts 136 of host device 132. It will be appreciated by those skilled in the art that additional circuitry and control signals can be provided, and that the memory module of FIG. 1 has been simplified to help focus on the invention.

Figure 2:
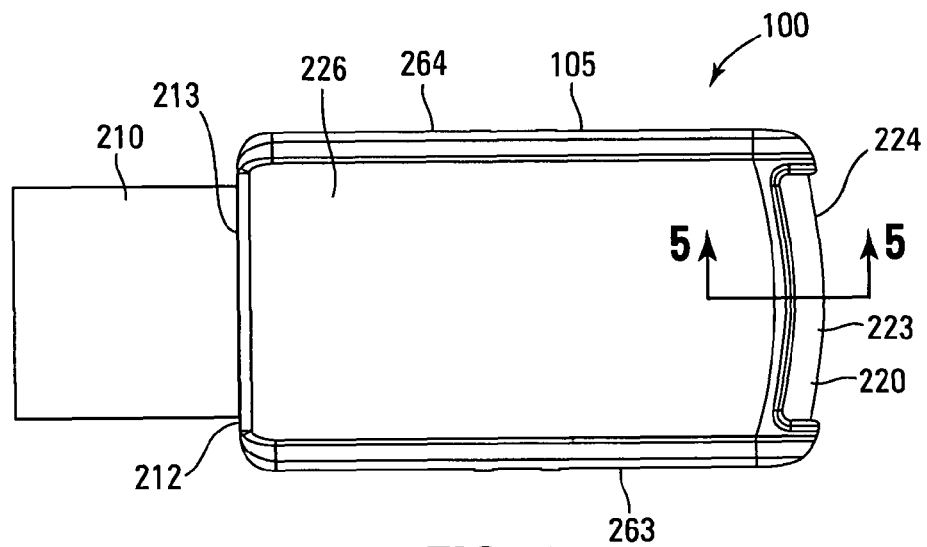
FIGS. 2, 3, and 4 are respectively top, bottom, and front views of an embodiment of a memory module, according to another embodiment of the disclosure.
Figure 3:
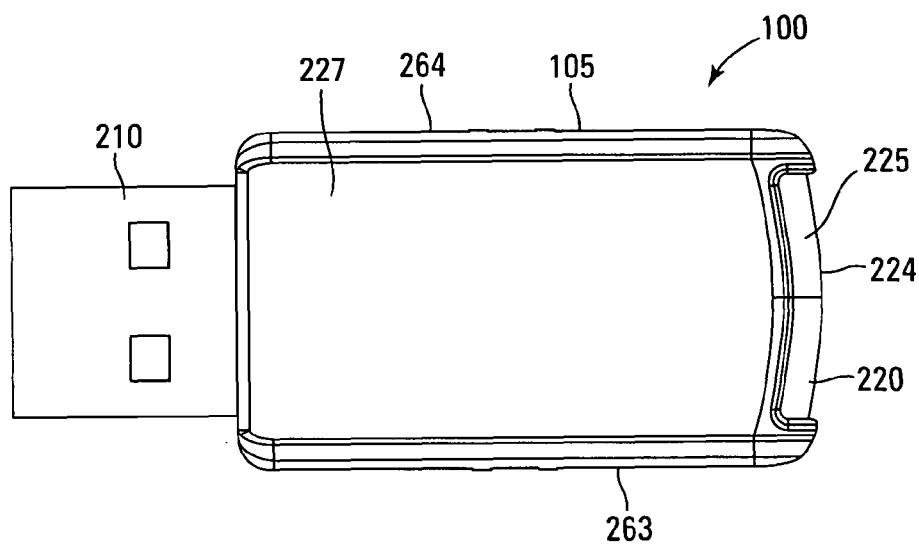
Figure 4:
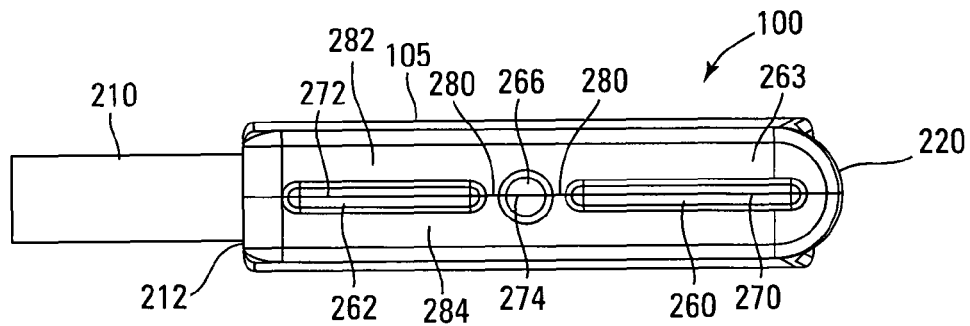

FIGS. 2, 3, and 4 are respectively top, bottom, and front views of memory module 100, according to an embodiment.

Note that the back of memory module 100 may be a mirror image of the front for one embodiment. For one embodiment, a male connector 210, e.g., a USB Type-A male connector, corresponding to contacts 144 of FIG. 1, extends from a side 212 of housing 105, as shown in FIGS. 2-4, and is electrically connected to memory device 102, e.g., using electrical traces (not shown) formed in circuit board 103. Specifically, connector 210 extends through an opening 213 in side 212 of housing 105, as shown in FIG. 2. For one embodiment, housing 105 may be formed from plastic and male connector 210 is an electrical conductor, such as metal.

For one embodiment, a light transmission element, such as a light-pipe 220, forms a portion of housing 105 at a side 224 of housing 105 that is opposite side 212 of housing 105, as shown in FIGS. 2-4. For one embodiment, light-pipe 220 is formed as individual component and is connected to housing 105 to form an integral portion of housing 105. Note that light-pipe 220 wraps around side 224 so that substantially opposing portions 223 and 225 of an exterior surface of light-pipe 220 respectively form portions of the exterior surface of top wall 226 and the exterior surface of bottom wall 227 of housing 105 adjacent side 224, as shown in FIGS. 2 and 3. This enables the portions of the exterior surfaces top wall 226 and bottom wall 227 corresponding to light-pipe 220 to illuminate. Alternatively, the light transmitting element may be a clear lens, e.g., of clear plastic.

Figure 5:
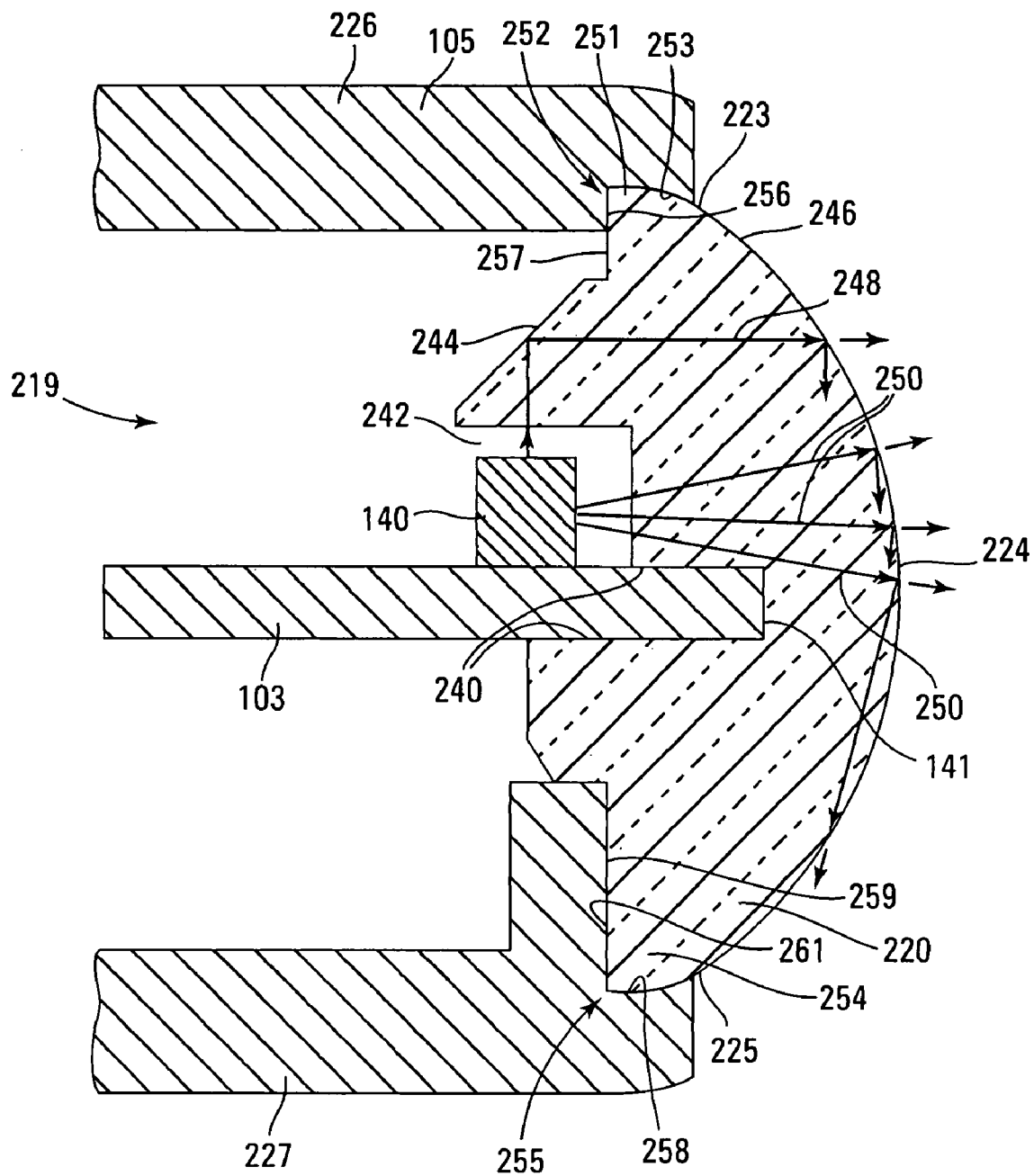
FIG. 5, a cross-sectional view taken along line 5-5 of FIG. 2, according to another embodiment of the disclosure.

For one embodiment, light source 140 may be surface mounted on circuit board 103 adjacent end 141 of circuit board 103, as shown in FIG. 5, a cross-sectional view taken along line 5-5 of FIG. 2. For another embodiment, a portion of circuit board 103 is contained in a slot 240 that extends into the interior of light-pipe 220 from an interior 219 of housing 105, as shown in FIG. 5. For one embodiment, light source 140 is located in a blind opening (or notch) 242 that extends into the interior of light-pipe 220 from the interior of housing 105 so that a portion of light-pipe 220 directly overlies, e.g., lies directly vertically above, an upper portion of light source 140, as shown in FIG. 5. Positioning light source 140 in blind opening 242 optically couples light source 140 to light-pipe 220.

Note that light-pipe 220 transmits light from light source 140 within the interior of memory module 100 to the exterior of memory module 100. Also note that a portion of light-pipe 220 that is substantially opposite connector 210, i.e., the portion of light-pipe 220 located between top wall 226 and bottom wall 227, as shown in FIG. 5, forms a sidewall of housing 105. A surface 244 of light-pipe 220 located within housing 105 and lying substantially vertically above, with respect to FIG. 5, light source 140 is inclined at substantially 45 degrees from the vertical or toward to an exterior surface 246 of light-pipe 220, as shown in FIG. 5.

When light source 140 is lighted, light is emitted from the top and sides of light source 140, as shown in FIG. 5. Substantially vertical rays of light emitted from the top of light source 140 pass through light-pipe 220 and are reflected by substantially 90 degrees by inclined surface 244, as illustrated by a light ray 248, for one embodiment. The light reflected by inclined surface 244 passes through light-pipe 220 from inclined surface, 244 to the exterior surface 246 of light-pipe 220. Light rays 250 emitted from the side of light source 140 pass directly through light-pipe 220 to exterior surface 246. When light rays 248 and 250 arrive at exterior surface 246, a portion of each light ray is transmitted through exterior surface 246 and a portion is reflected by substantially 90 degrees by exterior surface 246 due to the curvature of exterior surface 246, as shown in FIG. 5.

A portion of the light reflected by exterior surface 246 passes to portions of exterior surface 246 that are not visible to the surface of circuit board 103 on which light source 140 is mounted, i.e., portions of exterior surface 246 that lie below the surface of circuit board 103 on which light source 140 is mounted and that face in a direction substantially opposite to that surface of circuit board 103, as shown in FIG. 5. This illuminates the portions of exterior surface 246 that are not visible to the surface of circuit board 103 on which light source 140 is mounted, such as the portion 225 that forms a portion of the exterior surface of bottom wall 227. This means that light source 140 is optically coupled to substantially the entire exterior surface 246 of light-pipe 220, including portions that are not visible to the surface of circuit board 103 on which light source 140 is mounted, such as the portion 225 that forms a portion of the exterior surface of bottom wall 227.

Note that the portions 223 and 225 of exterior surface 246 of light-pipe 220 that respectively form portions of the exterior surfaces of top wall 226 and bottom wall 227 can be illuminated by a single surface-mounted light source, owing to the configuration of FIG. 5. This means that housing 105 is backward compatible with existing memory-module circuit board configurations that typically use a single surface-mounted light source. In alternative embodiments, a second light source may be mounted on the surface of circuit board 103 that faces opposite the surface on which light source 140 is mounted, or a light source may be mounted on end 141 of circuit board 103.

For one embodiment, the interior surfaces of light-pipe 220 bounding slot 240 may forcibly engage circuit board 103. That is, circuit board 103 may be press fit into slot 240 of light-pipe 220. This acts to secure light-pipe 220 to housing 105. Note that press fitting printed circuit board 103 into slot 240 acts to secure light-pipe 220 to housing 105 without additional manufacturing steps, such as heat staking the light-pipe to housing 105, as is often done in conventional memory module housings with light-pipes.

For another embodiment, portions 251 and 254 of light-pipe 220 are respectively contained in notches 252 and 255 respectively formed in an end of top wall 226 opposite connector 210 and in an end of bottom wall 227 opposite connector 210, as shown in FIG. 5. Notch 252 includes a curved interior surface 253 that engages light-pipe 220 along a portion of its curved exterior surface. Notch 252 further includes a substantially vertical surface 256, with respect to FIG. 5, that is connected to the curved interior surface 256, that faces away from connector 210 toward light-pipe 220, and that abuts a substantially vertical interior surface 257, with respect to FIG. 5, of light-pipe 220, as shown in FIG. 5. Notch 255 includes a curved interior surface 258 that engages light-pipe 220 along another portion of its curved exterior surface. Notch 255 further includes a substantially vertical surface 259, with respect to FIG. 5, that is connected to the curved interior surface 258, that faces away from connector 210 toward light-pipe 220, and that abuts a substantially vertical interior surface 261, with respect to FIG. 5, of light-pipe 220, as shown in FIG. 5. The curved interior surfaces 253 and 258 of notches 252 and 255, i.e., of top wall 226 and bottom wall 227, respectively hold light-pipe 220 in abutment with the substantially vertical surfaces 256 and 259. This, in conjunction with press fitting printed circuit board 103 into slot 240, acts to prevent light-pipe 220 from becoming separated from housing 105.

For other embodiments, memory module 100 may be assembled by connecting circuit board 103 to light-pipe 220, e.g., by press fitting circuit board 103 into slot 240 of light-pipe 220. After connecting circuit board 103 to light-pipe 220, housing 105 is connected to light-pipe 220 so that light-pipe forms an integral portion of housing 105. Connecting housing 105 to light-pipe 220 encloses circuit board 103, with one or more memory modules 102 and light source 140 mounted thereon, within housing 105. Note that for one embodiment, connecting housing 105 to light-pipe 220 includes receiving portions 251 and 254 of light-pipe 220 in the notches 252 and 255 respectively formed in top wall 226 and bottom wall 227 of housing 105 (FIG. 5).

For another embodiment, grooves 260 and 262 are formed in exterior surfaces of each of front wall 263 and back wall 264 of housing 105, as shown in FIG. 4 for front wall 263. A depression (or dimple) 266 is also formed in each of front wall 263 and back wall 264 and is located between grooves 260 and 262. For one embodiment, grooves 260 and 262 and depression 266 are aligned so that the longitudinal central axes 270 and 272 respectively of grooves 260 and 262 and a diameter 274 of depression 266 lie on a common line, as shown in FIG. 4. Note that for one embodiment, the exterior surfaces of front wall 263 and back wall 264 are substantially perpendicular to the exterior surfaces top wall 226 and bottom wall 227.

For one embodiment, front wall 263 and back wall 264 of housing 105 are formed when top wall 226 and bottom wall 227 of housing 105 are connected to light-pipe 220. That is, integral portions of top wall 226 that extend substantially perpendicularly from top wall 226 and integral portions of bottom wall 227 that extend substantially perpendicularly from bottom wall 227 abut each other to form front wall 263 and back wall 264. This is shown in FIG. 4 for front wall 263, where an integral portion 282 extending substantially perpendicularly from top wall 226 and integral portion 284 extending substantially perpendicularly from bottom wall 227 abut each other along a line corresponding to axes 270 and 272 to form front wall 263. Also note that when top wall 226 and bottom wall 227 are connected together in this fashion, opening 213 is formed in side 212 of housing 105 (FIG. 2) through which connector 210 passes.

FIGS. 6-9 illustrate a storage device 601, e.g., a removable or portable storage device, according to another embodiment. Storage device 601 includes a memory module, such as memory module 100 (FIGS. 1-5), and a two-way removable cover (or cap) 600. FIGS. 6 and 8 illustrate a first configuration of storage device 601, where cover 600 encloses at least connector 210 of memory module 100. FIGS. 7 and 9 illustrate a second configuration of storage device 601, where cover 600 encloses a portion of housing 105 of memory module 100 opposite connector 210, e.g., the portion of housing 105 that includes light-pipe 220. Note that a top wall 605 and a bottom wall 610 of cover 600 are respectively shown in FIGS. 6 and 7 and that the top wall 605 and bottom wall 610 of cover 600 are mirror images of each other. FIGS. 8 and 9 are cross-sectional views of the configurations of storage device 601 respectively shown in FIGS. 6 and 7.

The first configuration of storage device 601 shown in FIGS. 6 and 8, where connector 210 is enclosed within cover 600, corresponds to a non-operational configuration, where memory module 100 is not being used, but is being stored or transported. The second configuration of storage device 601 shown in FIGS. 7 and 9, where connector 210 is exposed and light-pipe 220 is enclosed within cover 600, corresponds to an operational configuration, where memory module 100 is connected to a host device or is about to be connected to a host device.

For one embodiment, cover 600 is a sheath-like structure that encloses a portion of memory module 100 while leaving a remaining portion uncovered. For example, in the first configuration of FIGS. 6 and 8, connector 210 and an adjacent portion of housing 105 are enclosed within cover 600, while light-pipe 220 and an adjacent portion of housing 105 are exposed. In the second configuration of FIGS. 7 and 9, light-pipe 220 and an adjacent portion of housing 105 are enclosed within cover 600, while connector 210 and an adjacent portion of housing 105 are exposed.

For one embodiment, cover 600 is of a material, such as a clear or translucent material, e.g., clear or translucent plastic, that can pass light therethrough. This is so that when storage device 601 is in the configuration of FIG. 8, with connector 210 exposed and connected to a host device and light-pipe 220 enclosed by cover 220, light from light source 140 that is transmitted through light-pipe 220 to the exterior of memory module 100 is visible through cover 600. Note that light emitted from the opposing exterior portions 223 and 225 of light-pipe 220 (FIGS. 2, 3, and 5) is transmitted to portions of top wall 605 and bottom wall 610 so that the light is visible through these portions of top wall 605 and bottom wall 610.

Cover 600 has an opening 615 that provides access to a hollow interior 620 (FIGS. 8-9) of cover 600 for memory module 100. Opening 615 is located between top wall 605 and bottom wall 610 of cover 600 and is located opposite a sidewall 618 of cover 600, as shown in FIGS. 6-9. Opening 615 communicatively couples interior 620 of cover 600 to an environment located exteriorly of cover 600. Note that memory module 100 is inserted through opening 615 and into interior 620 of cover 600.

For one embodiment, a hole 622 passes through an exterior portion of cover 600, e.g., substantially perpendicularly to top wall 605 and bottom wall 610, at a location opposite opening 615. Specifically, hole 622 passes through a portion of sidewall 618, as shown in FIGS. 6-9. A lanyard (or tether) 623, such as a keychain, cord, strap, or the like, may be looped through hole 622, as shown in FIGS. 6 and 7.

For another embodiment, as shown in FIGS. 6 and 7, openings 624 and 625, e.g., having U-shapes, are respectively formed in top wall 605 and bottom wall 610 of cover 600 between a front wall 632 of cover 600 and a back wall 634 of cover 600 and are substantially perpendicular to opening 615. Note that openings 624 and 625 respectively extend into top wall 605 and bottom wall 610 of cover 600 from a side 616 of cover 600 that includes opening 615. Openings 624 and 625 each expose additional surface area of housing 105. The additional surface area of housing 105 exposed by openings 624 and 625 increases the surface area of housing 105 that can be grasped by a user when moving cover 600 relative to memory module 100 and thus facilitates the separation of cover 600 from memory module 100.

Openings 624 and 625 respectively bifurcate a portion of top wall 605 and a portion bottom wall 610 to form tines (or prongs) 626 and 627 that extend from a base 628 of cover 600, as shown in FIGS. 6 and 7. Interior surfaces of base 628 and tines 626 and 627 define the hollow interior 620 (FIGS. 8 and 9).

For one embodiment, tine 627 wraps around a portion of the exterior surface of front wall 263 of housing 105 to cover that portion of the exterior surface of front wall 263 and to cover portions of the exterior surface of top wall 226 and the exterior surface of bottom wall 227 of housing 105, as shown in FIGS. 6 and 7. Specifically, for another embodiment, in the first configuration of storage device 601, tine 627 covers a portion of the exterior surface of front wall 263 of housing 105 that includes all of groove 262 and a portion of groove 260, as shown in FIG. 8, and, in the second configuration of storage device 601, tine 627 covers another portion of the exterior surface of front wall 263 of housing 105 that includes all of groove 260 and a portion of groove 262, as shown in FIG. 9.

Tine 626 wraps around the exterior surface of back wall 264 of housing 105 to cover that portion of the exterior surface of back wall 264 and to cover portions of the exterior surface of top wall 226 and the exterior surface of bottom wall 227 of housing 105, as shown in FIGS. 6 and 7. Specifically, for one embodiment, in the first configuration of storage device 601, tine 626 covers a portion of the exterior surface of back wall 264 of housing 105 that includes all of groove 262 and a portion of groove 260, as shown in FIG. 8, and, in the second configuration of storage device 601, tine 626 covers another portion of the exterior surface of back wall 264 of housing 105 that includes all of groove 260 and a portion of groove 262, as shown in FIG. 9.

Each of openings 624 and 625 is interposed between tines 626 and 627 so as to expose portions of the exterior surfaces of top wall 226 and bottom wall 227 of housing 105. Specifically, for one embodiment, in the first configuration of storage device 601, openings 624 and 625 expose first portions of the exterior surfaces of top wall 226 and bottom wall 227 of housing 105, as shown in FIG. 6, and, in the second configuration of storage device 601, openings 624 and 625 expose second portions of the exterior surfaces of top wall 226 and bottom wall 227 of housing 105, as shown in FIG. 7.

For some embodiments, the second portions of the exterior surfaces of top wall 226 and bottom wall 227 exposed in the second configuration of storage device 601 by openings 624 and 625 may also include a portion of the first portions of the exterior surfaces of top wall 226 and bottom wall 227 that were exposed by openings 624 and 625 in the first configuration of storage device 601 and vice versa. That is, for some embodiments, common portions of housing 105 may be exposed when storage device 601 is either in the first or second configuration, and common portions of housing 105 may be enclosed by cover 600 when storage device 601 is either in the first or second configuration.

As best seen from FIGS. 8-9, a protrusion (or bump) 630 extends inwardly from an interior surface of front wall 632 of cover 600 and from an interior surface of back wall 634 of cover 600 toward the interior 620 of cover 600. When cover 600 covers connector 210, protrusion 630 of front wall 632 of cover 600 and protrusion 630 of back wall 634 of cover 600 respectively extend into depressions 266 in front wall 263 and back wall 264 of housing 105, as shown in FIG. 8. When cover 600 covers the end opposite connector 210, e.g., lightpipe 220, protrusion 630 of front wall 632 of cover 600 and protrusion 630 of back wall 634 of cover 600 also respectively extend into depressions 266 in front wall 263 and back wall 264 of housing 105, as shown in FIG. 9. For one embodiment, protrusions 630 are in direct opposition to each other, as shown in FIGS. 8 and 9. Note that protrusions 630 and depressions 266 are located so that when protrusions 630 are seated in depressions 266, cover 600 acts to increase the length of memory module 100 in the non-operational configuration of FIGS. 6 and 8 and in the operational configuration of FIGS. 7 and 9, making memory module 100 easier to grasp via cover 600.

For one embodiment, protrusions 630 are contained within tines 626 and 627. That is, a protrusion 630 extends from the interior surface of a portion of front wall 632 of cover 600 that corresponds to tine 627, as shown in FIGS. 8 and 9, and that is connected between the portions of tine 627 that respectively cover portions of front surface 226 and back surface 227 of housing 105, as shown in FIGS. 6 and 7. Similarly, a protrusion 630 extends from the interior surface of a portion of back wall 634 of cover 600 that corresponds to tine 626, as shown in FIGS. 8 and 9, and that is connected between the portions of tine 626 that respectively cover portions of front surface 226 and back surface 227 of housing 105, as shown in FIGS. 6 and 7.

For one embodiment, as cover 600 is moved relative to memory module 100 to either cover connector 210 of memory module 100 or to cover the end of memory module 100 that is opposite connector 210, the protrusions 630 of front wall 632, e.g., of tine 627, and back wall 634, e.g., of tine 626, of cover 600 either ride, while proceeding to cover connector 210, in the grooves 262 (FIGS. 4 and 8) that are formed in front wall 263 and back wall 264 of housing 105 of memory module 100 or ride, while proceeding to cover the end opposite connector 210, in the grooves 260 (FIGS. 4 and 8) that are formed in front wall 263 and back wall 264 of housing 105 of memory module 100. This is illustrated for back wall 634, e.g., tine 637, of cover 600 and back wall 264 of housing 105 in FIG. 10A.

As cover 600 continues to move relative to memory module 100, protrusions 630 exit either groove 260 or groove 262 and move onto a portion 280 of front wall 263 and back wall 264 of housing 105 that is elevated above the base of either groove 260 or groove 262. This is illustrated in FIG. 10B for back wall 634 of cover 600 and back wall 264 of housing 105.

For one embodiment, an uppermost surface of portion 280 may correspond to the exterior surface of either front wall 263 or back wall 264 of housing 105 into which grooves 260 and 262 are formed. Note that FIGS. 4 and 8-9 show that grooves 260 and 262 terminate at an elevated portion 280 and that there is an elevated portion 280 between an end of groove 260 and each depression 266 and another elevated portion 280 between an end of groove 262 and each depression 266.

For one embodiment, cover 600 is of a resilient material, such as a resilient plastic, so that the portions of front wall 632 and back wall 634 of cover 600 from which protrusions 630 extend, e.g., tines 626 and 627 are resilient. Therefore, tines 626 and 627 are deflected apart and move away from each other, as shown by arrow 1010 in FIG. 10B, in response to protrusions 630 exiting either groove 260 or groove 262 and moving onto an elevated portion 280 of front wall 263 and back wall 264 of housing 105.

Figure 10C:
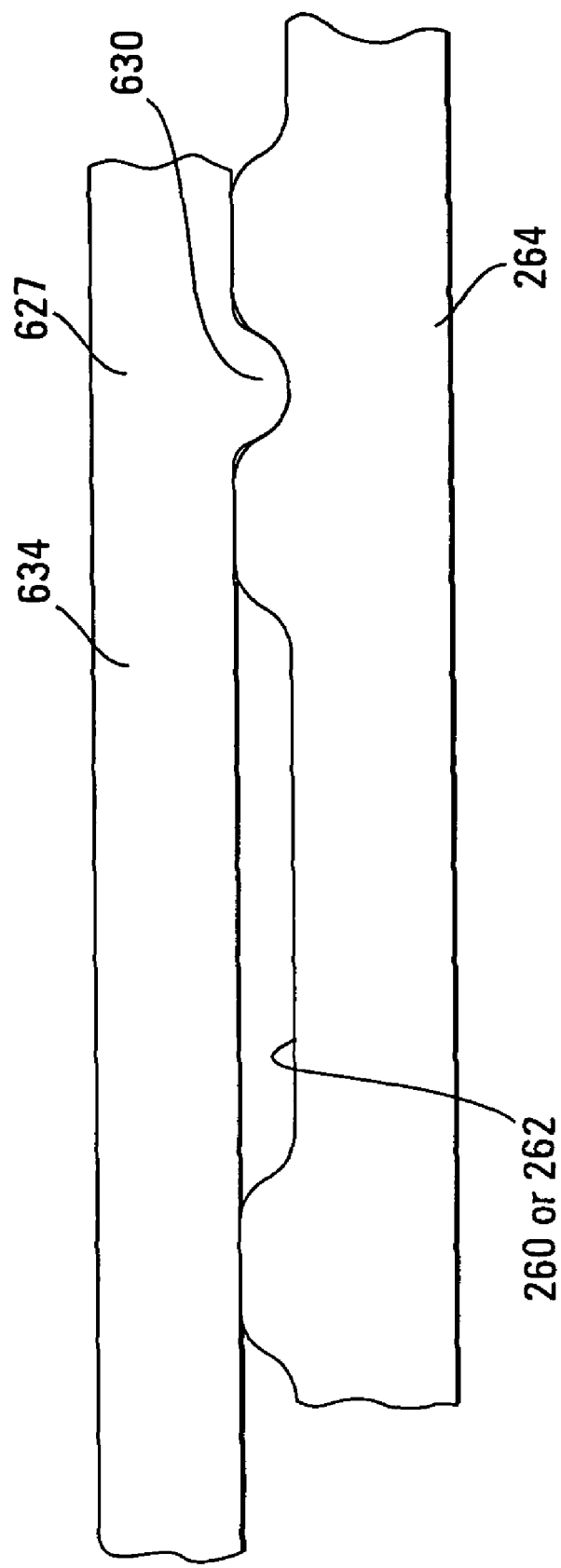

As cover 600 continues to move relative to memory module 100, protrusions 630 move past the elevated portion 280 of front wall 263 and back wall 264 of housing 105 and subsequently snap into depression 266 of front wall 263 and back wall 264 of housing 105 as tines 626 and 627 move toward each other, in a direction opposite arrow 1010, due to their resiliency. This is illustrated in FIG. 10C for front wall 632 of cover 600 and front wall 263 of housing 105 and further in FIGS. 8 and 9.

The resiliency of tines 626 and 627 effectively biases protrusions 630 into depressions 266. For another embodiment, the resiliency of tines 626 and 627 biases protrusions 630 into either groove 260 or groove 262. Note that grooves 260 and grooves 262 effectively guide protrusions 630 to elevated portions 280 and thus to depressions 266. Moreover, biasing protrusions 630 in depressions 266 acts to reduce the likelihood of cover 600 from becoming unintentionally separated from memory module 100 when storage device 601 is being used and memory module 100 is coupled to a host or when storage device 601 is being stored or transported.

CONCLUSION

Although specific embodiments have been illustrated and described herein it is manifestly intended that the scope of the claimed subject matter be limited only by the following claims and equivalents thereof.

What is claimed is:

1. A storage device, comprising:
   a memory module enclosed within a housing; and
   a removable cover;
   wherein in a first configuration of the storage device, while leaving a light-pipe of the housing exposed, the cover entirely encloses at least a connector that extends from the housing and that is electrically coupled to a circuit board of the memory module;
   wherein in a second configuration of the storage device, while leaving at least the connector exposed, the cover entirely encloses at least the light-pipe; and
   wherein a portion of the circuit board is inserted into a slot that extends into an interior of the light-pipe so that opposing surfaces of the circuit board are respectively in physical contact with opposing bounding surfaces of the slot.

2. The storage device of claim 1, wherein portion of the housing is exposed in both the first and second configurations.

3. The storage device of claim 1, wherein a protrusion of the cover extends into a depression in the housing when the storage device is in either the first or second configuration.

4. The storage device of claim 3, wherein the cover is resilient and biases the protrusion of the cover into the depression in the housing.

5. The storage device of claim 1, wherein the cover is of a material that can pass light therethrough so that when the light-pipe is illuminated, light from the light-pipe can be transmitted through the cover when the cover entirely encloses the light-pipe in the second configuration.

6. The storage device of claim 5, wherein the light can be transmitted through opposing portions of the cover.

7. The storage device of claim 1, wherein the cover comprises a pair of tines that extends from a portion of the cover that entirely encloses, in the first configuration of the storage device, at least the connector and that entirely encloses, in the second configuration of the storage device, at least the light-pipe.

8. The storage device of claim 7, wherein a protrusion extends from each of the tines, and wherein each protrusion extends into a depression in the housing when the storage device is in either the first or second configuration.

9. A storage device, comprising:
   a memory module enclosed within a housing; and
   a removable cover;
   wherein in a first configuration of the storage device, while leaving a light-pipe of the housing exposed, the cover entirely encloses at least a connector that extends from the housing and that is electrically coupled to the memory module;
   wherein in a second configuration of the storage device, while leaving at least the connector exposed, the cover entirely encloses at least the light-pipe;
   wherein the cover comprises a pair of tines that extends from a portion of the cover that entirely encloses, in the first configuration of the storage device, at least the connector and that entirely encloses, in the second configuration of the storage device, at least the light-pipe,
   wherein a protrusion extends from each of the tines, and wherein each protrusion extends into a depression in the housing when the storage device is in either the first or second configuration; and
   wherein the tines are resilient so as to bias the protrusions thereof into their respective depressions.

10. The storage device of claim 1, wherein a hole passes though a portion of the cover for receiving a lanyard therethrough.

11. The storage device of claim 1, wherein a lanyard passes through a portion of the cover.

12. A storage device, comprising:
    a memory module enclosed within a housing, the housing comprising:
       a light-pipe;
       opposing first exterior surfaces; and
       opposing second and third exterior surfaces, each of the second and third exterior surfaces having a single depression formed therein, each single depression interposed between first and second grooves formed in each of the second and third exterior surfaces; and
    a removable cover that can pass light therethrough and that has a pair of resilient tines extending from a portion thereof, each tine having a protrusion extending therefrom;
    wherein, in a first configuration of the storage device, while leaving the light-pipe and first portions of the opposing first exterior surfaces of the housing exposed, the portion of the cover from which the tines extend encloses at least a connector that extends from the housing and that is electrically coupled to the memory module;
    wherein the protrusions are respectively biased, by the resilient tines, in the single depressions formed in the opposing second and third exterior surfaces of the housing when the storage device is in the first configuration;
    wherein, in a second configuration of the storage device, while leaving at least the connector exposed, the portion of the cover from which the tines extend encloses the light-pipe and at least the first portions of the opposing first exterior surfaces of the housing;
    wherein when the storage device is in the second configuration, the protrusions are respectively biased, by the resilient tines, in the same single depressions in which the protrusions are respectively biased when the storage device is in the first configuration;
    wherein the first grooves of the opposing second and third exterior surfaces are configured to respectively receive the protrusions therein and to guide the protrusions to their respective depressions when the cover is being positioned to enclose the connector; and
    wherein the second grooves of the opposing second and third exterior surfaces are configured to respectively receive the protrusions therein and to guide the protrusions to their respective depressions when the cover is being positioned to expose the connector.

13. The storage device of claim 12, wherein second portions of the opposing first exterior surfaces of the housing are exposed in the first and second configurations.

14. The storage device of claim 12, wherein the light-pipe is optically coupled to a light source that is mounted on a surface of a circuit board of the memory module.

15. The storage device of claim 14, wherein portions of an exterior surface of the light-pipe that are not visible to the surface of the circuit board of the memory module on which the light source is mounted are optically coupled to the light source.

16. A storage device, comprising:
    a memory module enclosed within a housing, the housing comprising:
       a light-pipe;
       opposing first exterior surfaces; and
       opposing second exterior surfaces having depressions formed therein; and a removable cover that can pass light therethrough and that has a pair of resilient tines extending from a portion thereof, each tine having a protrusion extending therefrom;

wherein, in a first configuration of the storage device, while leaving the light-pipe and first portions of the opposing first exterior surfaces of the housing exposed, the portion of the cover from which the tines extend encloses at least a connector that extends from the housing and that is electrically coupled to the memory module;

wherein the protrusions are respectively biased, by the resilient tines, in the depressions formed in the opposing second exterior surfaces of the housing when the storage device is in the first configuration;

wherein, in a second configuration of the storage device, while leaving at least the connector exposed, the portion of the cover from which the tines extend encloses the light-pipe and at least the first portions of the opposing first exterior surfaces of the housing;

wherein the protrusions are respectively biased, by the resilient tines, in the depressions formed in the opposing second exterior surfaces of the housing when the storage device is in the second configuration;

wherein the light-pipe is optically coupled to a light source that is mounted on a surface of a circuit board of the memory module; and wherein a portion of the light-pipe is angled at substantially 45 degrees toward an exterior surface of the light-pipe for reflecting light from the light source by substantially 90 degrees toward the exterior surface of the light-pipe.

17. The storage device of claim 14, wherein a portion of the circuit board is inserted into a slot that extends into an interior of the light-pipe from an interior of the housing.

18. The storage device of claim 14, wherein a portion of the circuit board is press fit into a slot that extends into an interior of the light-pipe from an interior of the housing.

19. The storage device of claim 12, wherein portions of the light-pipe respectively form portions of the opposing first exterior surfaces of the housing.

20. The storage device of claim 19, wherein another portion of the light-pipe is located opposite the connector.

21. The storage device of claim 12, wherein, in the first configuration of the storage device, second portions of the opposing first exterior surfaces of the housing are exposed between the tines and, in the second configuration of the storage device, third portions of the opposing first exterior surfaces of the housing are exposed between the tines.

22. The storage device of claim 12, wherein the opposing first exterior surfaces of the housing are respectively exterior surfaces of opposing first and second walls of the housing, and wherein the opposing first and second walls comprise first and second curved interior surfaces that engage the light-pipe respectively along portions of a curved exterior surface of the light-pipe.

23. A removable memory module, comprising:
a circuit board;
one or more memory devices disposed on the circuit board;
a housing that encloses the circuit board and the one or more memory devices;
a connector extending from the housing and electrically coupled to the one or more memory devices;
wherein the housing comprises a light-pipe optically coupled to a light source disposed on the circuit board;
wherein a portion of the circuit board is inserted into a slot that extends into an interior of the light-pipe so that opposing surfaces of that portion of the circuit board are respectively in physical contact with bounding surfaces of the slot;
wherein the housing further comprises opposing first and second exterior surfaces respectively having depressions formed therein; and
wherein the first and second exterior surfaces also respectively have first and second grooves respectively formed on first and second sides of the respective depressions formed in the first and second exterior surfaces.

24. The memory module of claim 23, wherein the light-pipe has an exterior surface that has substantially opposing first and second portions that respectively form portions of opposing third and fourth exterior surfaces of the housing and wherein a third portion of the exterior surface of the light-pipe is located opposite the connector.

25. The memory module of claim 23, wherein the light source is mounted on a surface of the circuit board that is contiguous with and faces in the same direction as one of the opposing surfaces that are respectively in physical contact with opposing bounding surfaces of the slot.

26. The memory module of claim 23, wherein the portion of the circuit board that is inserted into the slot is press fit into the slot.

27. The memory module of claim 23, wherein a portion of the light-pipe is angled at substantially 45 degrees toward the exterior surface of the light-pipe for reflecting light from the light source by substantially 90 degrees toward the exterior surface of the light-pipe.

28. The memory module of claim 24:
wherein the opposing third and fourth exterior surfaces of the housing are respectively exterior surfaces of opposing first and second walls of the housing;
wherein the substantially opposing first and second portions of the exterior surface of the light-pipe are substantially opposing first and second curved portions of the exterior surface of the light-pipe; and
wherein the opposing first and second walls of the housing comprise first and second curved interior surfaces that engage the exterior surface of the light-pipe respectively along the substantially opposing first and second curved portions of the exterior surface of the light-pipe.

29. A storage device, comprising:
a memory module; comprising:
a circuit board;
one or more memory devices disposed on the circuit board;
a housing that encloses the circuit board and the one or more memory devices; and
a connector extending from an end of the housing and electrically coupled to the one or more memory devices; and
a removable cover having opposing protrusions;
wherein the housing comprises opposing exterior surfaces each having a single depression formed therein;
wherein each of the opposing exterior surfaces also has a groove formed on either side of the single depression of the respective exterior surface so that the single depression of the respective exterior surface is interposed between the grooves of that surface;
wherein the opposing protrusions of the cover respectively extend into the single depressions formed in the opposing exterior surfaces of the housing when the cover encloses the connector and when the cover encloses a light-pipe located at an end of the housing opposite the end from which the connector extends;

wherein the grooves on one side of the depressions are configured to respectively receive the opposing protrusions of the housing therein and to direct the opposing protrusions of the housing to the respective single depressions when the cover is being positioned to cover the connector; and wherein the grooves on the other side of the depressions are configured respectively receive the opposing protrusions of the housing therein and to direct the opposing protrusions of the housing to the respective single depressions when the cover is being positioned to cover the light-pipe.

30. The storage device of claim 29, wherein the housing is connected to the light-pipe by a press-fit between the circuit board and the light-pipe.

31. The storage device of claim 30, wherein curved interior surfaces of the housing respectively engage the light-pipe along portions of a curved exterior surface of the light-pipe.

32. A storage device, comprising:
a memory module; and
a cover comprising:
a base;
first and second resilient tines extending from the base;
wherein interior surfaces of the base and the first and second tines define a hollow interior of the cover that encloses a portion of the memory module; and
first and second protrusions respectively extending from the interior surfaces of the first and second tines that are configured to be respectively biased by the resiliency thereof into first and second depressions in the memory module;
wherein each of the first and second depressions is interposed between first and second grooves in the memory module;
wherein the first grooves are respectively configured to receive the first and second protrusions and to respectively direct the first and second protrusions to the first and second depressions when positioning the cover over a connector of the memory module to place the storage device in a non-operational configuration; and
wherein the second grooves are respectively configured to receive the first and second protrusions and to respectively direct the first and second protrusions to the first and second depressions when positioning the cover over a light-pipe of the memory module that is opposite the connector to place the storage device in an operational configuration where the connector is exposed.

33. The storage device of claim 32, wherein the base and the first and second resilient tines can pass light therethrough.

34. The storage device of claim 32, wherein a hole passes through an exterior of the cover for receiving a lanyard therethrough.

35. A method of configuring a storage device, comprising:
positioning a cover of the storage device over a housing of a memory module of the storage device to enclose at least a connector extending from an end of the housing within the cover while leaving a light-pipe located at an opposite end of the housing exposed to define a first configuration of the storage device;
completely disconnecting the cover from the housing; and
after disconnecting the cover from housing, re-positioning the cover over the housing to enclose, within the cover, at least the light-pipe while leaving at least the connector exposed to define a second configuration of the storage device,
wherein positioning the cover of the storage device over the housing of the memory module of the storage device to enclose at least the connector within the cover comprises respectively receiving first and second opposing protrusions of the cover in first and second opposing depressions in the housing and wherein re-positioning the cover over the housing to enclose, within the cover, at least the light pipe comprises respectively receiving the first and second opposing protrusions of the cover in the first and second opposing depressions in the housing.

36. A method of configuring a storage device, comprising:
positioning a cover of the storage device over a housing of a memory module of the storage device to enclose at least a connector extending from an end of the housing within the cover while leaving a light-pipe located at an opposite end of the housing exposed to define a first configuration of the storage device, wherein positioning the cover of the storage device over the housing of the memory module of the storage device to enclose at least the connector within the cover comprises respectively receiving first and second opposing protrusions of the cover in first and second opposing depressions in the housing;
completely disconnecting the cover from the housing;
after disconnecting the cover from housing, re-positioning the cover over the housing to enclose, within the cover, at least the light-pipe while leaving at least the connector exposed to define a second configuration of the storage device, wherein re-positioning the cover over the housing to enclose, within the cover, at least the light pipe comprises respectively receiving the first and second opposing protrusions of the cover in the first and second opposing depressions in the housing; and
deflecting the first and second opposing protrusions of the cover apart from each other before respectively receiving the first and second opposing protrusions in the first and second opposing depressions in the housing.

37. The method of claim 36, wherein when positioning the cover of the storage device over the housing of the memory module of the storage device to enclose at least the connector within the cover, the first and second opposing protrusions, before being deflected apart, respectively ride in first and second opposing grooves in the housing in response to moving the cover relative to the housing, and wherein when re-positioning the cover over the housing to enclose, within the cover, at least the light pipe, the first and second opposing protrusions, before being deflected apart, respectively ride in third and fourth opposing grooves, different from the first and second opposing grooves, in the housing in response to moving the cover relative to the housing, wherein the first depression is interposed between the first and third grooves and the second depression is interposed between the second and fourth grooves.

38. The method of claim 35, wherein respectively receiving the first and second protrusions of the cover in first and second depressions in the housing comprises respectively biasing the first and second protrusions of the cover in first and second depressions in the housing.

39. A method of configuring a storage device, comprising:
positioning a cover of the storage device over a housing of a memory module of the storage device to enclose at least a connector extending from an end of the housing within the cover while leaving a light-pipe located at an opposite end of the housing exposed to define a first configuration of the storage device;
completely disconnecting the cover from the housing; and after disconnecting the cover from housing, re-positioning the cover over the housing to enclose, within the cover, at least the light-pipe while leaving at least the connector exposed to define a second configuration of the storage device;

wherein positioning the cover of the storage device over the housing of a memory module of the storage device to enclose at least the connector within the cover comprises:

respectively receiving first and second protrusions of the cover in first and second grooves in the housing;

moving the cover relative to the housing to move the first and second protrusions within the first and second grooves to respectively guide the first and second protrusions to first and second elevated regions respectively located at the ends of the first and second grooves;

moving the cover relative to the housing to move the first and second protrusions respectively onto the first and second elevated regions from the first and second grooves to deflect the first and second protrusions apart from each other;

moving the cover relative to the housing to move the first and second protrusions past the first and second elevated regions; and after the first and second protrusions move past the first and second elevated regions, respectively biasing the first and second protrusions into first and second depressions in the housing.

40. The method of claim 39, wherein re-positioning the cover over the housing to enclose, within the cover, at least the light-pipe comprises:

respectively receiving the first and second protrusions of the cover in third and fourth grooves in the housing;

moving the cover relative to the housing to move the first and second protrusions within the third and fourth grooves to respectively guide the first and second protrusions to third and fourth elevated regions respectively located at the ends of the third and fourth grooves;

moving the cover relative to the housing to move the first and second protrusions respectively onto the third and fourth elevated regions from the third and fourth grooves to deflect the first and second protrusions apart from each other;

moving the cover relative to the housing to move the first and second protrusions past the third and fourth elevated regions; and after the first and second protrusions move past the third and fourth elevated regions, respectively biasing the first and second protrusions into the first and second depressions in the housing.

41. The method of claim 40, wherein the first and third grooves are aligned with each other and the first depression and the second and fourth grooves are aligned with each other and the second depression.

42. A method of operating a storage device, comprising:

removing a cover of the storage device, covering a connector of a memory module of the storage device while leaving a light-pipe of the memory module exposed, from the connector to expose the connector;

enclosing the light-pipe within the cover while leaving the connector exposed;

coupling the storage device to a host device using the exposed connector;

illuminating the light-pipe when the storage device is coupled to the host device;

wherein the connector is coupled to a circuit board of the memory module and a portion of the circuit board is inserted into a slot that extends into an interior of the light-pipe so that opposing surfaces of the circuit board are respectively in physical contact with opposing bounding surfaces of the slot.

43. The method of claim 42, wherein enclosing the light-pipe within the comprises biasing opposing protrusions extending from the cover into depressions in the memory module.

44. A method of forming a memory module, comprising:

connecting a circuit board, having one or more memory devices and a light source mounted thereon, to a light-pipe so that a portion of the circuit board extends into a slot in the light-pipe and so that opposing surfaces of that portion of the circuit board respectively physically contact bounding surfaces of the slot;

after connecting the circuit board to the light-pipe, connecting a housing to the light-pipe so that the circuit board is enclosed within the housing and so that a connector electrically connected to the one or more memory devices extends from the housing; and forming a removable cover:

wherein in a first configuration of the memory module, while leaving the light-pipe exposed, the cover encloses at least the connector; and wherein in a second configuration of the memory module, while leaving at least the connector exposed, the cover encloses at least the light-pipe.

45. The method of claim 44, wherein connecting the circuit board to the light-pipe comprises contacting a curved exterior surface of the light-pipe respectively along portions of the curved exterior surface of the light-pipe with curved interior surfaces of the housing.

46. The method of claim 44, wherein connecting the circuit board to the light-pipe comprises respectively receiving substantially opposing portions of the light-pipe within notches formed in the housing so that curved interior surfaces of the notches engage the light-pipe respectively along curved exterior surfaces of the substantially opposing portions of the light-pipe.

47. The method of claim 44, wherein the portion of the circuit board that extends into the slot in the light-pipe is press fit into the slot.

48. The method of claim 44, wherein connecting the circuit board to the light-pipe comprises receiving the light source into a notch that extends into an interior of light-pipe.

49. A method of forming a memory module, comprising:

connecting a circuit board, having one or more memory devices and a light source mounted thereon, to a light-pipe by press fitting a portion of the circuit board into a slot formed in the light-pipe;

after connecting the circuit board to the light-pipe, connecting a housing to the light-pipe by respectively receiving substantially opposing portions of the light-pipe within notches formed in the housing so that curved interior surfaces of the notches engage the light-pipe respectively along curved exterior surfaces of the substantially opposing portions of the light-pipe; and forming a removable cover;

wherein in a first configuration of the memory module, while leaving the light-pipe exposed, the cover encloses at least the connector; and wherein in a second configuration of the memory module, while leaving at least the connector exposed, the cover encloses at least the light-pipe; and wherein connecting the housing to the light-pipe encloses the circuit board within the housing so that a connector electrically connected to the one or more memory devices extends from the housing.

50. The storage device of claim 1, wherein the light-pipe has an inclined portion overlying and aligned with a top of the light source of the memory module for reflecting light from the top of the light source toward an exterior surface of the light-pipe.

51. The method of claim 42, wherein when the light-pipe illuminates, when the storage device is coupled to the host device, light from the light-pipe is transmitted through opposing surfaces of the light-pipe.

52. The method of claim 51, wherein illuminating the light-pipe when the storage device is coupled to the host device comprises:
   illuminating a light source of the storage device when the storage device is coupled to the host device;
   receiving light in a first direction from the light source at an inclined surface of the light-pipe; and
   reflecting light from the inclined surface in a second direction that is substantially 90 degrees from the first direction toward an exterior surface of the light-pipe.

53. The method of claim 52:
   wherein light from the light source is further received at a portion of the exterior surface of the light-pipe that is visible to a surface of a circuit board of the memory module on which the light source is mounted;
   wherein the portion of the exterior surface of the light-pipe that is visible to the surface of the circuit board on which the light source is mounted transmits a first portion of the light received thereat to one of the opposing surfaces of the light-pipe and reflects a second portion of the light received thereat to a portion of the exterior surface of the light-pipe that is not visible to the surface of the circuit board of the memory module on which the light source is mounted; and
   wherein the portion of the exterior surface of the light-pipe that is not visible to the surface of the circuit board on which the light source is mounted transmits a portion of the light reflected thereto from the portion of the exterior surface of the light-pipe that is visible to the surface of the circuit board on which the light source is mounted to another of the opposing surfaces of the light-pipe.

54. The method of claim 43, wherein the depressions in the memory module comprise single depressions respectively formed in opposing surfaces of the memory module, and further comprising, before biasing the opposing protrusions extending from the cover into the depressions in the memory module:
   respectively receiving the opposing protrusions extending from the cover in grooves respectively formed in the opposing surfaces of the memory module; and
   using the grooves to respectively direct the opposing protrusions extending from the cover to the depressions.

55. A method of operating a storage device, comprising:
   entirely enclosing a light-pipe of a memory module of the storage device within a cover of the storage device while leaving a connector of the memory module exposed;
   coupling the storage device to a host device using the exposed connector;
   illuminating the light-pipe when the storage device is coupled to the host device;
   wherein entirely enclosing the light-pipe of the memory module of the storage device within a cover of the storage device comprises biasing opposing protrusions extending from the cover into depressions in the memory module;
   wherein the depressions in the memory module comprise single depressions respectively formed in opposing surfaces of the memory module, and further comprising, before biasing the opposing protrusions extending from the cover into the depressions in the memory module:
      respectively receiving the opposing protrusions extending from the cover in grooves respectively formed in the opposing surfaces of the memory module; and
      using the grooves to respectively direct the opposing protrusions extending from the cover to the depressions; and
   wherein the grooves are first grooves, and further comprising:
      removing the storage device from the host device;
      removing the cover from the light-pipe; and
      enclosing the connector within the cover, while leaving at least the light-pipe exposed, wherein enclosing the connector within the cover comprises:
         respectively receiving the opposing protrusions extending from the cover in second grooves respectively formed in the opposing surfaces of the memory module;
         using the second grooves to respectively direct the opposing protrusions extending from the cover to the depressions in the memory module; and
         biasing the opposing protrusions extending from the cover into the depressions in the memory module.

56. The method of claim 55, wherein removing the cover from the light-pipe comprises completely disconnecting the cover from the memory module.

57. The method of claim 55, wherein one the depressions is interposed between one of the first grooves and one of the second grooves and another one of the depressions is interposed between another one of the first grooves and another one of the second grooves.

58. The method of claim 42, wherein removing the cover from the connector comprises completely disconnecting the cover from the memory module.

59. The method of claim 44, wherein the light-pipe has an inclined portion overlying and aligned with a top of the light source for reflecting light from the top of the light source toward an exterior surface of the light-pipe.

60. The method of claim 49, wherein opposing surfaces of the portion of the circuit board press fit into the slot formed in the light-pipe are respectively in physical contact with opposing bounding surfaces of the slot formed in the light-pipe.

* * * * *

UNITED STATES PATENT AND TRADEMARK OFFICE
CERTIFICATE OF CORRECTION

PATENT NO. : 7,881,051 B2  
APPLICATION NO. : 11/714314  
DATED : February 1, 2011  
INVENTOR(S) : Hyekyung Kim Page 1 of 1

It is certified that error appears in the above-identified patent and that said Letters Patent is hereby corrected as shown below:

In column 9, line 20, in Claim 2, after "wherein" insert -- a --.

In column 9, line 61, in Claim 9, delete "light-pipe," and insert -- light-pipe; --, therefor.

In column 13, line 67, in Claim 35, delete "device," and insert -- device; --, therefor.

In column 16, line 8, in Claim 43, delete "the comprises" and insert -- the cover comprises --, therefor.

In column 16, line 23, in Claim 44, delete "cover:" and insert -- cover; --, therefor.

In column 18, line 41, in Claim 57, delete "one the" and insert -- one of the --, therefor.

Signed and Sealed this  
Fifth Day of April, 2011

David J. Kappos  
*Director of the United States Patent and Trademark Office*